(12) United States Patent
Han et al.

(10) Patent No.: US 11,804,375 B2
(45) Date of Patent: Oct. 31, 2023

(54) HALOALKYNYL DICOBALT HEXACARBONYL PRECURSORS FOR CHEMICAL VAPOR DEPOSITION OF COBALT

(71) Applicant: ENTEGRIS, INC., Billerica, MA (US)

(72) Inventors: Sangbum Han, Norfolk, VA (US); Seobong Chang, Suwon (KR); Bryan C. Hendrix, Danbury, CT (US); Jaeeon Park, HwaSung (KR); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/952,985

(22) Filed: Nov. 19, 2020

(65) Prior Publication Data

US 2021/0082708 A1    Mar. 18, 2021

Related U.S. Application Data

(63) Continuation of application No. 15/819,620, filed on Nov. 21, 2017, now Pat. No. 10,872,770.

(60) Provisional application No. 62/425,807, filed on Nov. 23, 2016.

(51) Int. Cl.
| | | |
|---|---|---|
| H01L 21/285 | (2006.01) | |
| C23C 16/06 | (2006.01) | |
| C23C 16/16 | (2006.01) | |
| C07F 15/06 | (2006.01) | |
| C23C 16/18 | (2006.01) | |

(52) U.S. Cl.
CPC ........ *H01L 21/28556* (2013.01); *C07F 15/06* (2013.01); *C23C 16/06* (2013.01); *C23C 16/16* (2013.01); *C23C 16/18* (2013.01)

(58) Field of Classification Search
CPC .................................................. H01L 21/28556
See application file for complete search history.

(56) References Cited

U.S. PATENT DOCUMENTS

| | | | |
|---|---|---|---|
| 3,364,243 A | 1/1968 | Daniels | |
| 9,997,362 B2 * | 6/2018 | Baum | ............... H01L 21/76864 |
| 2005/0136659 A1 | 6/2005 | Yun | |
| 2007/0077742 A1 | 4/2007 | Matsuki | |
| 2007/0202254 A1 | 8/2007 | Ganguli | |
| 2010/0135845 A1 | 6/2010 | Kumar | |
| 2013/0260555 A1 | 10/2013 | Zope | |

(Continued)

FOREIGN PATENT DOCUMENTS

| | | |
|---|---|---|
| CN | 1398867 A | 2/2003 |
| CN | 101001977 A | 7/2007 |

(Continued)

*Primary Examiner* — William D Young

(57) ABSTRACT

The present disclosure relates to a bridging asymmetric haloalkynyl dicobalt hexacarbonyl precursors, and ultra high purity versions thereof, methods of making, and methods of using these bridging asymmetric haloalkynyl dicobalt hexacarbonyl precursors in a vapor deposition process. One aspect of the disclosure relates to an ultrahigh purity bridging asymmetric haloalkynyl dicobalt hexacarbonyl precursor of the formula $Co_2(CO)_6(R^3C\equiv CR^4)$, where $R^3$ and $R^4$ are different organic moieties and $R^4$ is more electronegative or more electron withdrawing compared to $R^3$.

10 Claims, 1 Drawing Sheet

(56) References Cited

U.S. PATENT DOCUMENTS

| | | | |
|---|---|---|---|
| 2015/0093890 A1* | 4/2015 | Blackwell | H01L 21/28556 |
| | | | 438/602 |
| 2015/0246941 A1 | 9/2015 | Peters | |
| 2016/0369402 A1 | 12/2016 | Baum | |
| 2017/0053876 A1 | 2/2017 | Wu | |
| 2017/0178956 A1* | 6/2017 | Park | H01L 21/76883 |
| 2018/0135174 A1 | 5/2018 | Cooper et al. | |

FOREIGN PATENT DOCUMENTS

| | | |
|---|---|---|
| JP | 2002145836 A | 5/2002 |
| JP | 2010084215 A | 4/2010 |
| JP | 2011241155 A | 12/2011 |
| JP | 2015224227 A | 12/2015 |
| KR | 100459609 B1 | 12/2004 |
| TW | 200528394 A | 9/2005 |
| TW | 201409613 A | 3/2014 |
| WO | 2015157004 A1 | 10/2015 |

* cited by examiner

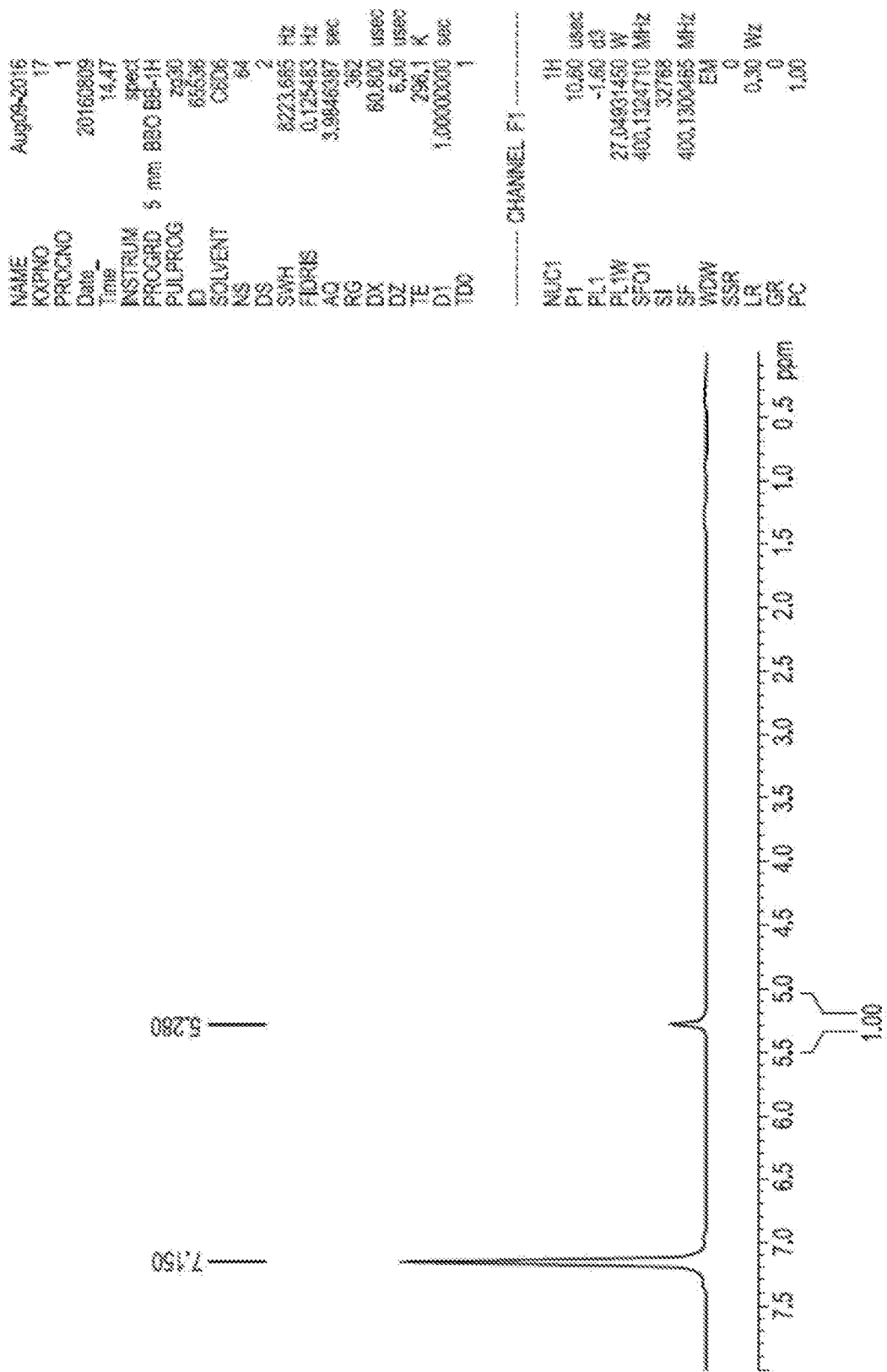

HALOALKYNYL DICOBALT HEXACARBONYL PRECURSORS FOR CHEMICAL VAPOR DEPOSITION OF COBALT

PRIORITY CLAIM

This application is a continuation application of U.S. patent application Ser. No. 15/819,620, which claims priority under 35 USC § 119(e) from United States Provisional Patent Application having Ser. No. 62/425,807, filed Nov. 23, 2016, entitled "HALOALKYNYL DICOBALT HEXACARBONYL PRECURSORS FOR CHEMICAL VAPOR DEPOSITION OF COBALT," the entirety of which is incorporated herein by reference.

FIELD OF THE INVENTION

The present disclosure relates to high purity, low resistivity vapor deposited cobalt materials and to precursors and processes for forming such high purity, low resistivity cobalt on substrates. The cobalt material deposited by the precursors and processes may be used in the manufacture of semiconductor products, flat-panel displays, and solar panels.

BACKGROUND

Cobalt is finding increased use in semiconductor manufacturing. For example cobalt disilicide has been progressively displacing titanium silicide in microelectronic devices as feature and linewidth dimensions decrease. Cobalt also is currently under consideration as a conductive cap over copper lines or as part of the barrier/adhesion layer liner for copper lines and contacts, as an encapsulant material, as a seed material for electroless and electroplating processes, and as a replacement material for copper in wiring and interconnects of integrated circuits. Cobalt additionally has elicited interest as a result of its magnetic properties for data storage applications and its potential for spintronics applications.

Interconnects are the backbone of integrated circuitry, providing power and ground connections and distribution of clock and other signals. Local interconnects comprise the lines that connect gates and transistors, intermediate interconnects provide wiring within functional blocks of integrated circuitry, and global interconnects distribute clock and other signals and provide power and ground connections for the entire integrated circuit. Interconnects increasingly are a dominant factor in determining system performance and power dissipation of integrated circuits.

In the manufacture of integrated circuitry devices in which copper is used as a metallization material, cobalt liners and back end of the line (BEOL) interconnect caps have been developed for protection of copper interconnects. Recently, it has been proposed to replace the copper interconnect due to problems associated with electron migration. Although various cobalt precursors have been applied to such interconnect fabrication, the vapor deposited cobalt thin films have been plagued by the presence of excess residual carbon and oxygen impurities, which in turn has caused such thin films to exhibit relatively low conductivity (resistivity >50 microohm-cm).

There is continuing need for high purity, low resistivity vapor deposited cobalt films and other deposited cobalt structures that are used in forming interconnects and other metallization features of integrated circuits.

The problem with using many bridging alkylalkynyl dicobalt hexacarbonyl precursors like dicobalt hexacarbonyl butylacetylene (CCTBA) for vapor deposition of cobalt thin films are their viscosity and relatively low vapor pressure. CCTBA has a boiling point of 52° C. at 0.8 torr (106.7 Pa), and exists as a red liquid at 25° C., so that it requires additional heating for the delivery of vapor to a deposition process. This additional heating however accelerates the decomposition of the bridging alkylalkynyl dicobalt hexacarbonyl precursor. Further, parts of the bridging alkylalkynyl dicobalt hexacarbonyl precursors are relatively stable during a vapor deposition process and so can leave residual impurities like carbon in the deposited cobalt film which increase the resistivity of the film.

It is an aim of the invention to address at least one of the above-described problems or another problem associated with the prior art.

SUMMARY

From a first aspect, the invention provides a precursor or precursor composition for a vapor deposition process of a cobalt film, the precursor or precursor composition comprising: a bridging asymmetric haloalkynyl dicobalt hexacarbonyl precursor of formula $Co_2(CO)_6(R^3C\equiv CR^4)$, wherein $R^3$ and $R^4$ are different organic moieties and $R^4$ is an electron withdrawing organic moiety relative to $R^3$.

The problem of low precursor volatility and high deposited cobalt film resistivity can be solved by using the defined bridging asymmetric haloalkynyl dicobalt hexacarbonyl precursors where the di-cobalt precursors are functionalized with asymmetric alkyne derivatives that include groups with high electronegativity on one side of the alkyne. Such bridging asymmetric haloalkynyl dicobalt hexacarbonyl precursors may have low viscosity compared to CCTBA and can be used at room temperature in bubblers to provide vapor deposited cobalt films with low electrical resistivity and lower amounts of incorporated impurities like carbon.

At least one of $R^3$ and $R^4$ comprises one or more halogen atoms, i.e. is a halo substituted organic moiety. The bridging asymmetric haloalkynyl dicobalt hexacarbonyl precursors may optionally have a structure where one of $R^3$ and $R^4$ comprises one or more halogen atoms and the other is free of halogen atoms.

From a second aspect, the invention provides a precursor or precursor composition for a vapor deposition process of a cobalt film, the precursor or precursor composition comprising: a bridging asymmetric haloalkynyl dicobalt hexacarbonyl precursor of formula $Co_2(CO)_6(R^3C\equiv CR^4)$, wherein $R^3$ and $R^4$ are different organic moieties, $R^4$ comprises one or more halogen atoms and $R^3$ is free of halogen atoms.

The precursors may be adapted for use in a vapor deposition process to deposit low resistivity cobalt material. In some versions of the disclosure the molecular purity of the bridging asymmetric haloalkynyl dicobalt hexacarbonyl precursor may be 99% or greater.

In the bridging asymmetric haloalkynyl dicobalt hexacarbonyl precursors, $R^3$ may optionally be selected from the group consisting of H, an alkyl moiety, and an aryl moiety. $R^4$ may suitably be a haloalkyl or haloaryl moiety, optionally a fluoroalkyl moiety or a fluoroaryl moiety. In some versions, $R^4$ is selected from the group consisting of —$CF_3$, —$C_2F_5$, and —$C_6F_5$ moieties.

The bridging asymmetric haloalkynyl dicobalt hexacarbonyl precursor composition may comprise one or more solvents to form a solvent solution of the precursor. In the solvent solution composition of the bridging asymmetric haloalkynyl dicobalt hexacarbonyl precursor, the concentration of precursor may optionally be from 0.05 moles precursor per liter of solvent (M) to 0.5 moles precursor per liter of solvent (M). In some versions of the bridging asymmetric haloalkynyl dicobalt hexacarbonyl precursor compositions, the amount of precursor in the solvent may be up to 5 wt %. In some versions of the precursor composition the solvent in the solvent solution comprises an organic solvent, optionally a hydrocarbon solvent.

The bridging asymmetric haloalkynyl dicobalt hexacarbonyl precursor or precursor composition of the first aspect of the invention may be used in a vapor deposition process to form cobalt on a substrate. Low resistivities may advantageously be achieved. The process comprises depositing the precursor vapor on a substrate to form the cobalt on the substrate.

Thus, from a third aspect, the invention provides cobalt deposition process, comprising: volatilizing a precursor or precursor composition according to any aspect, version or embodiment of the invention to form precursor vapor; and, depositing the precursor vapor on a substrate in a chamber.

During the vapor deposition process, the substrate exposed to the bridging asymmetric haloalkynyl dicobalt hexacarbonyl precursor vapor may optionally be held at a temperature in a range of from 50° C. to 250° C. during deposition. The asymmetric haloalkynyl dicobalt hexacarbonyl precursor may suitably be in a vessel that is held at room temperature, or may be held at a temperature in a range of from 18° C. to 35° C. during the volatilization. The vapor deposition chamber during the process may be at a deposition pressure in a range of from 0.01 Torr to 100 Torr. The cobalt film formed or deposited on the substrate may optionally have a resistivity 100 $\mu\Omega$-cm or less when the film has a thickness of 100 angstroms or less.

The ability to volatilize the bridging asymmetric haloalkynyl dicobalt hexacarbonyl precursor at low temperature, and in some cases at room temperature, helps to prevent decomposition of the bridging asymmetric haloalkynyl dicobalt hexacarbonyl precursor which increases semiconductor manufacturing tool uptime and reduces costs. Because the low temperature volatilization reduces the decomposition of the bridging asymmetric haloalkynyl dicobalt hexacarbonyl precursor it also reduces the need and cost associated with the proper disposal of unusable bridging asymmetric haloalkynyl dicobalt hexacarbonyl precursor. The bridging asymmetric haloalkynyl dicobalt hexacarbonyl precursors can provide high cobalt film growth rate even with room temperature volatilization, and the resulting thin cobalt films can have low resistivity.

From a fourth aspect, the invention provides a cobalt film obtainable or obtained by the process according to the third aspect of the invention.

From a firth aspect, the invention provides the use of a bridging asymmetric haloalkynyl dicobalt hexacarbonyl precursor, for example according to any aspect, version or embodiment herein, in a vapor deposition process for the purpose of yielding high purity deposited cobalt films, for example films that contain less than 5 at % carbon and less than 3 at % oxygen.

From a sixth aspect, the invention provides the use of a bridging asymmetric haloalkynyl dicobalt hexacarbonyl precursor, for example according to any aspect, version or embodiment herein, in a vapor deposition process for the purpose of yielding deposited cobalt films containing less carbon and oxygen impurities than films which would be obtained under comparable conditions with a corresponding non-halogenated precursor.

BRIEF DESCRIPTION OF THE DRAWINGS

FIG. 1 illustrates the $H^1$ NMR in $C_6H_6$ of purified $Co_2(CO)_6(HC\equiv CCF_3)$, which can be abbreviated as CCFP.

DETAILED DESCRIPTION

The present disclosure relates to bridging asymmetric haloalkynyl dicobalt hexacarbonyl precursors, and ultra high purity versions thereof, methods of making, and methods of using these bridging asymmetric haloalkynyl dicobalt hexacarbonyl precursors in a vapor deposition process. One aspect of the disclosure relates to an ultrahigh purity bridging asymmetric haloalkynyl dicobalt hexacarbonyl precursor of the formula:

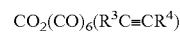

$Co_2(CO)_6(R^3C\equiv CR^4)$ where $R^3$ and $R^4$ are different organic moieties and $R^4$ is more electronegative or more electron withdrawing compared to $R^3$.

The bridging asymmetric haloalkynyl dicobalt hexacarbonyl precursors may optionally have a structure where one of $R^3$ and $R^4$ comprises one or more halogen atoms and the other is free of halogen atoms.

In some versions of the bridging asymmetric haloalkynyl dicobalt hexacarbonyl precursor, $R^3$ is selected from the group consisting of H, an alkyl moiety, or an aryl moiety. $R^4$ may, for example, be a methyl moiety, an ethyl moiety, or aryl moiety that includes one or more halogen atoms.

In some versions, the bridging asymmetric haloalkynyl dicobalt hexacarbonyl precursors may have a boiling point in the range of from 50° C. to 100° C.

In some versions the bridging asymmetric haloalkynyl dicobalt hexacarbonyl precursors are liquid at room temperature. The precursors may have a low enough viscosity that they can be used efficiently in a bubbler with the liquid being at or near room temperature.

The bridging asymmetric haloalkynyl dicobalt hexacarbonyl precursors in versions of the disclosure include those of formula $Co_2(CO)_6(R^3C\equiv CR^4)$ where $R^3$ is selected from the group consisting of H, an alkyl moiety, or an aryl moiety and $R^4$ is a methyl moiety, an ethyl moiety, or aryl moiety that includes one or more halogen atoms and that yield deposited cobalt films that contain less carbon and oxygen impurities compared to bridging symmetric alkyne dicobalt hexacarbonyl precursors of formula $Co_2(CO)_6(RC\equiv CR)$ where R is absent halogen atoms.

According to still another aspect of the disclosure, the bridging asymmetric haloalkynyl dicobalt hexacarbonyl precursors may be made by a method comprising reacting dicobalt octacarbonyl with an alkyne to give a bridging alkyne dicobalt hexacarbonyl as illustrated in reaction (1) below.

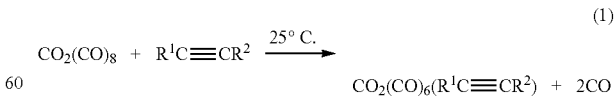

$$Co_2(CO)_8 + R^1C\equiv CR^2 \xrightarrow{25°\,C.} Co_2(CO)_6(R^1C\equiv CR^2) + 2CO \quad (1)$$

The $Co_2(CO)_6(R^1C\equiv CR^2)$ compound can undergo an exchange reaction with asymmetric haloalkynes of formula $R^3C\equiv CR^4$ (where $R^4$ as described herein includes one or more halogen atoms and $R^4$ is more electron withdrawing or electronegative than $R^3$) to yield a bridging asymmetric haloalkynyl dicobalt hexacarbonyl precursor of formula $Co_2(CO)_6(R^3C\equiv CR^4)$. This exchange reaction is illustrated in reaction (2) below.

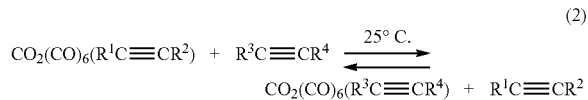

The resulting bridging asymmetric haloalkynyl dicobalt hexacarbonyl precursor of formula $Co_2(CO)_6(R^3C\equiv CR^4)$ can be purified to remove any residual ($R^1C\equiv CR^2$), greases, and other impurities.

Another aspect of the disclosure relates to a method purifying an ultrahigh purity bridging asymmetric haloalkynyl dicobalt hexacarbonyl precursor of the formula:

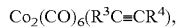

for example a asymmetric haloalkynyl dicobalt hexacarbonyl precursor according to any aspect, version or embodiment of the invention, where the bridging asymmetric haloalkynyl dicobalt hexacarbonyl precursor compound is chromatagraphically separated from reaction product impurities by passage through an affinity medium by elution with a solvent to recover an $Co_2(CO)_6(R^3C\equiv CR^4)$ eluate and concentrating the $Co_2(CO)_6(R^3C\equiv CR^4)$ eluate to recover a concentrate as the ultrahigh purity bridging asymmetric haloalkynyl dicobalt hexacarbonyl precursor.

The precursor resulting from the purification is at an ultrahigh purity of 99.0 wt %, 99.5 wt %, 99.95 wt %, 99.99 wt % or higher. Purity may be taken as molecular purity of the bridging asymmetric haloalkynyl dicobalt hexacarbonyl precursor. Alternatively, purity may be taken as elemental purity of Co. In some compositions the molecular or elemental purity may be from 99.9 wt % to 99.9999 wt % molecular purity of the bridging asymmetric haloalkynyl dicobalt hexacarbonyl precursor. For example, a sample of the bridging asymmetric haloalkynyl dicobalt hexacarbonyl precursor following purification may be 99.999 wt % molecular or elemental purity of bridging asymmetric haloalkynyl dicobalt hexacarbonyl and less than 0.001 wt % impurity. Higher molecular or elemental purity of the bridging asymmetric haloalkynyl dicobalt hexacarbonyl precursor in a vaporization ampoule or bubbler provides higher purity cobalt films on the substrate following vapor deposition.

The precursor asymmetric haloalkynyl dicobalt hexacarbonyl precursor may be employed directly for vapour deposition, or may form part of a precursor composition, for example when combined with a solvent. The bridging asymmetric haloalkynyl dicobalt hexacarbonyl precursor or composition may be packaged in a suitable container for subsequent use in a vapor deposition process. For example, the precursor, or a composition comprising the precursor, may be sealed in an ampoule that has connections and valves to maintain an inert atmosphere above the precursor and enable mounting to a gas manifold, vaporizer, or bubbler.

The viscosity of neat bridging asymmetric haloalkynyl dicobalt hexacarbonyl precursors or solutions of them with a solvent may suitably be in the range of 1 centipoise (cP) to 40 (cP). Compositions of bridging asymmetric haloalkynyl dicobalt hexacarbonyl with viscosities in this range may be used in bubblers or vaporizers directly to feed a vapor deposition process. Solutions of bridging asymmetric haloalkynyl dicobalt hexacarbonyl precursors may suitably include those that comprise from 5 wt % to 95 wt % solvent.

In some versions, solutions of bridging asymmetric haloalkynyl dicobalt hexacarbonyl precursors include from 0.05 moles precursor per liter of solvent (M) to 0.5 moles precursor per liter of solvent (M). Higher concentrations than 0.5 M precursor may be used, with the benefit being less vapor to dispose of and less chance of incorporation of solvent impurity in the deposited film. In some versions of solutions the solvent may be an organic solvent, optionally a hydrocarbon solvent.

In yet another aspect, the disclosure relates to a cobalt deposition process, comprising: volatilizing the bridging asymmetric haloalkynyl dicobalt hexacarbonyl precursor or precursor composition to form precursor vapor; and, depositing the precursor vapor on a substrate in a chamber. In some versions, the disclosure relates to a cobalt deposition process, comprising the acts or steps of volatilizing the bridging asymmetric haloalkynyl dicobalt hexacarbonyl precursor to form a bridging asymmetric haloalkynyl dicobalt hexacarbonyl precursor vapor; and contacting the bridging asymmetric haloalkynyl dicobalt hexacarbonyl precursor vapor with a substrate under vapor deposition conditions effective for depositing on the substrate (i) high purity, low resistivity cobalt or (ii) cobalt that is annealable by thermal annealing to form high purity, low resistivity cobalt.

Where the vapor deposition process is a chemical vapor deposition process (CVD), the CVD reactor conditions may optionally include a substrate process temperature in the range of from 50° C. to 250° C.

The vapor deposition process may optionally be performed at a reaction chamber pressure in the range of from 0.01 Torr to 100 Torr. Suitably an intert carrier inert gas flow, for example in the range of from 10 standard cubic centimeters per minute (sccm) to 1000 sccm, may be provided. Optionally, a flow of reactant or reactive gas, for example $H_2$, may be provided, optionally at a flow in the range of from 10 sccm to 5000 sccm.

Reactive gases that may be used during vapor deposition of the bridging asymmetric haloalkynyl dicobalt hexacarbonyl precursors include hydrogen (e.g., $H_2$ or atomic-H), nitrogen (e.g., N or atomic-N), ammonia ($NH_3$), a hydrogen and ammonia mixture ($H_2/NH_3$), hydrazine ($N_2H_4$), helium, argon, derivatives thereof, plasmas thereof, or combinations thereof. Inert gases like nitrogen, argon, and helium may be used as carrier or diluent gas.

The process may pulse the cobalt precursor with a constant flow of reactant gas or the process may pulse the cobalt precursor alternatively with the flow of reactant gas. In the latter case, a purge of inert gas may be inserted after the cobalt precursor flow and before the reactant gas flow and/or after the reactant gas flow and before the cobalt precursor flow. Under the condition of reactant gas flow without cobalt precursor flow, a plasma may also be lit in the gas to additionally activate the reactant gas.

In some versions, the bridging asymmetric haloalkynyl dicobalt hexacarbonyl precursors may have a boiling point in the range of from 50° C. to 100° C. This may allow them to exhibit sufficient vapor pressure near room temperature (18° C. to 35° C.) that cobalt films may be grown at rates of from 20 Å per minute to 35 Å per minute. In some versions, the asymmetric haloalkynyl dicobalt hexacarbonyl precursor may be held at a temperature in a range of from 18° C. to 35° C. in an ampoule or bubbler during the volatilization to produce precursor vapor for the deposition process.

The bridging asymmetric haloalkynyl dicobalt hexacarbonyl precursor may be volatilized from the neat material, or by passing an inert gas through the neat bridging asymmetric haloalkynyl dicobalt hexacarbonyl precursor using a bubbler. Solvent solutions of the bridging asymmetric haloalkynyl dicobalt hexacarbonyl precursor may also be volatilized using a bubbler or vaporizer. The bridging asymmetric haloalkynyl dicobalt hexacarbonyl precursor may be held at a temperature that provides sufficient vapor to the process. In some versions of a deposition process utilizing a bridging asymmetric haloalkynyl dicobalt hexacarbonyl precursor, the temperature of the precursor or a solution thereof is near room temperature or in the range of from 18° C. to 35° C. In some other versions of the deposition process the temperature of the bridging asymmetric haloalkynyl dicobalt hexacarbonyl precursor is kept below the decomposition or boiling point of the bridging asymmetric haloalkynyl dicobalt hexacarbonyl precursor. Low temperatures reduce the decomposition of the precursor in the ampoule and may reduce overall costs by decreasing waste.

The cobalt may be deposited as a film. Cobalt films prepared by vapor deposition of the bridging asymmetric haloalkynyl dicobalt hexacarbonyl precursors may be high purity films. The term "high purity" refers to cobalt films containing less than 5 at % carbon and less than 3 at % oxygen in the cobalt film. High purity films may also be characterized by their electrical resistivity which in versions of the disclosure are measured at room temperature (RT, 20° C.-23° C.). Versions of cobalt films prepared by vapor deposition of the bridging asymmetric haloalkynyl dicobalt hexacarbonyl precursor include those "low resistivity" cobalt films with a measured four point electrical resistivity that is less than 100 μΩ-cm for a 100 Å or thinner cobalt film. In some versions the cobalt films prepared by vapor deposition of the bridging asymmetric haloalkynyl dicobalt hexacarbonyl precursor include those "low resistivity" cobalt films that have a measured four point electrical resistivity that is 12 μΩ-cm to 30 μΩ-cm for a 300 Å or thinner cobalt film. Low resistivity films are beneficial for interconnects because they require less power and generate less heat than higher resistivity films.

The term "organic moiety" as used herein refers to hydrogen or moieties containing carbon. Such moieties may be optionally substituted as defined herein, for example with one or more halo substituents. Of course, moieties may also be unsubstituted. The term "moiety" is well understood in the art. Other terms such as "radical" or "group" are sometimes used to mean "moiety".

The term "electron-withdrawing" as applied to a substituent or moiety refers to the ability of a substituent or moiety to draw electrons to itself, e.g. more so than a hydrogen atom would if it occupied the same position in the molecule. This term is well understood and is discussed in Advanced Organic Chemistry, by J. March, 3th Ed. John Wiley and Sons, New York, N.Y. pp. 16-18 (1985). Non-limiting examples of electron withdrawing substituents include halo, especially fluoro, chloro, bromo, and iodo. Electron withdrawing moieties may include haloalkyl and haloaryl moieties.

The term "alkyl," as used herein, alone or in combination, refers to a straight-chain, branched, or cyclic alkyl moiety, or a moiety consisting of any combination of straight, branched, and/or cyclic moieties, which is a saturated aliphatic hydrocarbon moiety, suitably containing from 1-10 carbon atoms. In some versions, alkyl moieties comprise 1-6 carbon atoms. The term "alkyl moieties" is used in its broadest sense. Alkyl moieties may be optionally substituted as defined herein. Examples of alkyl moieties include methyl, ethyl, n-propyl, isopropyl, cyclopropyl, cyclopropylmethyl, n-butyl, isobutyl, sec-butyl, tert-butyl, cyclobutyl, pentyl, neopentyl, iso-amyl, hexyl, cyclohexyl, and the like.

The term "asymmetric haloalkynyl" refers to an organic group that has an acetylenic bond between first and second acytelenic carbons, with different moieties bonded to the first and second acytelenic carbons and a haloalkyl or a haloaryl moiety bonded to one or both acytelenic carbons. In some versions, the term "asymmetric haloalkynyl" refers to an organic group that has an acetylenic bond with an H, alkyl or aryl moiety bonded to the first acetylenic carbon and a haloalkyl or a haloaryl moiety bonded to the second acetylenic carbon. In some versions a haloalkynyl group may contain from 2 to 12 carbon atoms. The asymmetric haloalkynyl group is a bridging ligand in the dicobalt hexacarbonyl precursors. Non-limiting examples of asymmetric haloalkynyl bridging groups may include 3,3,3-trifluoropropyne and pentafluorophenyl acetylene.

The term "haloalkyl," as used herein, alone or in combination, refers to an alkyl moiety where one or more hydrogens are replaced with a halogen. Examples can include monohaloalkyl, dihaloalkyl and polyhaloalkyl moieties. A monohaloalkyl moiety, for one example, may have either an iodo, bromo, chloro or fluoro atom within the moiety. Dihalo and polyhaloalkyl moieties may have two or more of the same halo atoms or a combination of different halo moieties. Examples of haloalkyl moieties can include fluoromethyl, difluoromethyl, trifluoromethyl, chloromethyl, dichloromethyl, trichloromethyl, trichloroethyl, pentafluoroethyl, heptafluoropropyl, difluorochloromethyl, dichlorofluoromethyl, difluoroethyl, difluoropropyl, dichloroethyl and dichloropropyl. In some versions the alkyl moiety has all of the hydrogen atoms replaced by halogen atoms; the halogen atoms may be the same or different. Some versions of haloalkyl moieties include trifluoromethyl (—$CF_3$), and pentafluoroethyl (—$C_2F_5$).

Aromatic or aryl moieties include unsaturated, cyclic hydrocarbons having alternate single and double bonds. Benzene is a typical aromatic compound. The term haloaryl refers to an aryl moiety having one or more hydrogen atoms replaced by a halogen atom or one or more halogen atoms. When there are plurality of halogen atoms, the halogen atoms may be the same or different. In some versions the aryl moiety has all of the hydrogen atoms replaced by halogen atoms; the halogen atoms may be the same or different. In one version the aryl moiety is the pentafluorophenyl (—$C_6F_5$).

Various non-limiting embodiments of the invention are described in the following Examples.

Example 1. This example illustrates the deposition of a cobalt film that was made by volatilizing a composition comprising a bridging asymmetric haloalkynyl dicobalt hexacarbonyl precursor and depositing the precursor vapor on a $SiO_2$ substrate in a chamber.

The bridging asymmetric haloalkynyl dicobalt hexacarbonyl precursor in this example has a formula $Co_2(CO)_6$(HC≡$CCF_3$) which can be abbreviated as CCFP. In this dicobalt complex the different organic moieties bonded to the acetylenic carbon are —H and —$CF_3$, and —$CF_3$ is an electron withdrawing organic group relative to —H. An $^1H$ NMR of the $Co_2(CO)_6$(HC≡$CCF_3$) precursor is shown in FIG. 1.

A comparative cobalt film was deposited on $SiO_2$ from dicobalt hexacarbonyl butylacetylene (CCTBA). The conditions and outcomes of these two deposition runs are summarized in Table 1 below.

TABLE 1

| Conditions/Results | CCTBA | CCFP |
|---|---|---|
| Substrate | SiO$_2$ | SiO$_2$ |
| Substrate Temp. | 159° C. | 150° C. |
| Carrier gas and flow | Ar (500 sccm) | Ar (100 sccm) |
| | H$_2$ (1000 sccm) | H$_2$ (1000 sccm) |
| Deposition Chamber pressure | 29 Torr | 58 Torr |
| Bubbler Temperature | 40° C. | Room temp ~23° C. |
| Line temperature from bubbler to chamber | Bubbler temp, +10° C. | Bubbler temp, +10° C. |
| Growth Rate determined by X-ray fluorescence | 17 Å/min | 27 Å/min |
| R$_s$ four-probe @RT | 29.65 micro-Ohm · cm | 26.34 micro-Ohm · cm |

The results of this example show that the bridging asymmetric haloalkynyl dicobalt hexacarbonyl of formula Co$_2$(CO)$_6$(HC≡CCF$_3$) was able to be adapted to vapor deposit cobalt thin films on a substrate. The deposition rate was in the range of about 25 Å per minute to 30 Å per minute. The bubbler containing the CCFP was held at about room temperature. The resulting film from the CCFP precursor had a low resistivity of 26.34 micro-Ohm·cm measured at room temperature (RT, 20° C.-23° C.) compared to the film that was deposited under similar conditions using CCTBA which had a resistivity of 29.65 micro-Ohm·cm.

Example 2. This example illustrates the vapor deposition of cobalt films on a substrate under various process conditions using the bridging asymmetric haloalkynyl dicobalt hexacarbonyl of formula Co$_2$(CO)$_6$(HC≡CCF$_3$). The bubbler containing the Co$_2$(CO)$_6$(HC≡CCF$_3$) was at room temperature and a flow of Argon gas at 100 sccm was used. Hydrogen gas at a flow of 1000 sccm was used as a reactive gas for the cobalt deposition. The results of the experiment are summarized in Table 2 below.

TABLE 2

| Sample | Chamber Temp (° C.) | Chamber Pressure (Torr) | Deposition Time (sec) | Film Thickness (Å) | Sheet resistance (ohms/sq) | Resistivity (4-probe) (μΩ · cm) @ RT |
|---|---|---|---|---|---|---|
| A | 130 | 10 | 3000 | 261.3 | 22.78 | 59.45 |
| B | 170 | 50 | 600 | 479.7 | 6.21 | 29.75 |
| C | 150 | 30 | 1080 | 549.7 | 6.27 | 34.47 |

The results of this example show that low resistivity cobalt films of thickness ranging from 260 Å to 550 Å could be made using the bridging asymmetric haloalkynyl dicobalt hexacarbonyl precursor of formula Co$_2$(CO)$_6$(HC≡CCF$_3$) under a variety of chamber and process conditions. The cobalt films with the thicknesses in this range had a resistivity measured by the 4-point probe that ranged from 29.75 micro-ohm·cm to 59.45 micro-ohm·cm.

The present disclosure provides high purity bridging asymmetric haloalkynyl dicobalt hexacarbonyl precursors of formula Co$_2$(CO)$_6$(R$^3$C≡CR$^4$) that can be adapted to vapor deposit low resistivity (<100 μΩ-cm) cobalt films and products including these films. These low resistivity cobalt films may be deposited on various substrates and used in the manufacture of semiconductor memory chips, application specific integrated circuits (ASICs), microprocessors, flat-panel displays, and solar panels.

While various compositions and methods are described, it is to be understood that this invention is not limited to the particular molecules, compositions, designs, methodologies or protocols described, as these may vary. It is also to be understood that the terminology used in the description is for the purpose of describing the particular versions or embodiments only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "halo atom" is a reference to one or more halo atoms and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of embodiments of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some embodiments the term "about" refers to ±10% of the stated value, in other embodiments the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed or closed member groups.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The invention claimed is:

1. A cobalt film deposition process comprising:
volatilizing a precursor or precursor composition comprising a bridging asymmetric haloalkynyl dicobalt hexacarbonyl precursor of formula $Co_2(CO)_6(R^3C{\equiv}CR^4)$, wherein $R^3$ is H and $R^4$ is $-CF_3$ to form precursor vapor, wherein the precursor or precursor composition has a viscosity between 1 centipoise and 40 centipoise; and,
depositing the precursor vapor on a substrate in a chamber to form a deposited cobalt film,
wherein the substrate is at a temperature in a range of from 50° C. to 250° C. during deposition, the asymmetric haloalkynyl dicobalt hexacarbonyl precursor has a temperature in the range of from 18° C. to 35° C. during the volatization, the deposited cobalt film contains less than 5 atomic % carbon and less than 3 atomic % oxygen, and the precursor or precursor composition has a molecular purity of the bridging asymmetric haloalkynyl dicobalt hexacarbonyl precursor of 99% or greater.

2. The process of claim 1, wherein the precursor vapor is deposited at a pressure in a in range of from 0.01 Torr to 100 Torr in the chamber.

3. The process of claim 1, wherein the asymmetric haloalkynyl dicobalt hexacarbonyl precursor has a temperature in the range of from 20° C. to 23° C. during the volatization.

4. The process of claim 1, wherein the deposited cobalt film has a resistivity measured at room temperature of 100 µΩ-cm or less and the film has a thickness of 100 angstroms or less.

5. The process of claim 1, wherein the substrate is a semiconductor product.

6. The process of claim 1, wherein the precursor or precursor composition further comprises a solvent to form a solvent solution of the bridging asymmetric haloalkynyl dicobalt hexacarbonyl precursor, the solvent solution comprising in the range of from 0.05 M to 0.5 M bridging asymmetric haloalkynyl dicobalt hexacarbonyl precursor.

7. The process of claim 6, wherein the solvent comprises a hydrocarbon solvent.

8. The process of claim 1, wherein the precursor or precursor composition is packaged in a container for subsequent use in a vapor deposition process.

9. The process of claim 1, wherein the precursor or precursor composition is sealed in an ampoule configured to maintain an inert atmosphere and having connections and valves to enable mounting to a gas manifold, vaporizer, or bubbler.

10. The process of claim 1, wherein the precursor or precursor composition is volatilized at room temperature.

* * * * *